US010989388B2

(12) United States Patent
Boonekamp et al.

(10) Patent No.: US 10,989,388 B2
(45) Date of Patent: Apr. 27, 2021

(54) LIGHTING DEVICE HAVING A 3D PRINTED BICONVEX CYLINDRICAL LENS ARRAY

(71) Applicant: SIGNIFY HOLDING B.V., Eindhoven (NL)

(72) Inventors: Erik Paul Boonekamp, Eindhoven (NL); Hendrikus Hubertus Petrus Gommans, Eindhoven (NL); Paulus Albertus Van Hal, Eindhoven (NL); Coen Theodorus Hubertus Fransiscus Liedenbaum, Eindhoven (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/773,197

(22) PCT Filed: Oct. 27, 2016

(86) PCT No.: PCT/EP2016/075979
§ 371 (c)(1),
(2) Date: May 3, 2018

(87) PCT Pub. No.: WO2017/080842
PCT Pub. Date: May 18, 2017

(65) Prior Publication Data
US 2018/0320858 A1 Nov. 8, 2018

(30) Foreign Application Priority Data
Nov. 9, 2015 (EP) ..................... 15193626

(51) Int. Cl.
*B29D 11/00* (2006.01)
*F21K 5/00* (2006.01)
(Continued)

(52) U.S. Cl.
CPC ............ *F21V 5/007* (2013.01); *B29C 64/118* (2017.08); *B29D 11/00* (2013.01);
(Continued)

(58) Field of Classification Search
CPC ........ F21V 5/004; F21V 5/007; F21V 3/0625; F21K 9/90; B29D 11/00278; B29D 11/00365
See application file for complete search history.

(56) References Cited

U.S. PATENT DOCUMENTS 4,952,026 A * 8/1990 Bellman .......... B29D 11/00278
257/E31.127
5,594,526 A * 1/1997 Mori .................... G02B 3/0056
355/67
(Continued)

FOREIGN PATENT DOCUMENTS

CN 101541511 A 9/2009
CN 102906488 A 1/2013
(Continued)

OTHER PUBLICATIONS

O. Dross et al., "Kohler integrators embedded into illumination optics add functionality", Proc. SPIE 7103, Illumination Optics, 71030G, Sep. 24, 2008, pp. 1-8.
(Continued)

*Primary Examiner* — Ismael Negron

(57) ABSTRACT

An illumination device includes at least one light source and at least one optical component formed by a stack of at least two biconvex cylinder lenses, each lens having an optical axis perpendicular to a stacking direction of the optical component. The optical component is manufactured using a 3D printing process using fused deposition modeling.

11 Claims, 4 Drawing Sheets

(51) Int. Cl.
*F21V 5/00* (2018.01)
*B33Y 80/00* (2015.01)
*B33Y 10/00* (2015.01)
*B29C 64/118* (2017.01)
*F21V 5/10* (2018.01)
*F21V 5/04* (2006.01)

(52) U.S. Cl.
CPC ........ *B29D 11/00355* (2013.01); *B33Y 10/00* (2014.12); *B33Y 80/00* (2014.12); *F21V 5/043* (2013.01); *F21V 5/10* (2018.02)

(56) References Cited

U.S. PATENT DOCUMENTS

| | | | |
|---|---|---|---|
| 6,227,669 B1* | 5/2001 | Tiao | F21V 5/007 353/31 |
| 6,363,603 B1* | 4/2002 | Nemoto | B29C 43/021 29/458 |
| 6,373,635 B1* | 4/2002 | Fujimoto | B29D 11/00278 359/619 |
| 6,402,347 B1* | 6/2002 | Maas | F21V 5/007 315/312 |
| 6,850,368 B2* | 2/2005 | Shimizu | B29D 11/00278 359/619 |
| 7,226,185 B2* | 6/2007 | Dolgin | G02B 3/00 362/239 |
| 7,390,097 B2* | 6/2008 | Magarill | G02B 27/0905 353/38 |
| 8,016,455 B2* | 9/2011 | Paulussen | F21V 5/04 362/244 |
| 8,189,277 B2* | 5/2012 | Kintz | B29D 11/00365 359/741 |
| 8,416,498 B2* | 4/2013 | Sakaki | B29D 11/00278 359/619 |
| 8,705,175 B1 | 4/2014 | Lundgren et al. | |
| 9,217,551 B2* | 12/2015 | Joergensen | F21V 5/007 |
| 2002/0131464 A1 | 9/2002 | Sirbu et al. | |
| 2008/0124475 A1 | 5/2008 | Kritchman | |
| 2012/0019936 A1 | 1/2012 | Blessing et al. | |
| 2013/0141909 A1 | 6/2013 | Ashdown et al. | |
| 2015/0021628 A1 | 1/2015 | Medendorp, Jr. et al. | |
| 2015/0023643 A1 | 1/2015 | Chartoff et al. | |
| 2015/0247971 A1 | 9/2015 | Wertsberger et al. | |

FOREIGN PATENT DOCUMENTS

| | | |
|---|---|---|
| CN | 104401003 A | 3/2015 |
| EP | 1506435 B1 | 12/2006 |
| JP | 2007008004 A | 1/2007 |
| WO | WO2015102938 A1 | 7/2015 |
| WO | WO2015108574 A1 | 7/2015 |

OTHER PUBLICATIONS

J. Klein, et al., "Additive Manufacturing of Optically Transparent Glass", 3D Printing and Additive Manufacturing, vol. 2, No. 3, 2015, pp. 92-105.

* cited by examiner

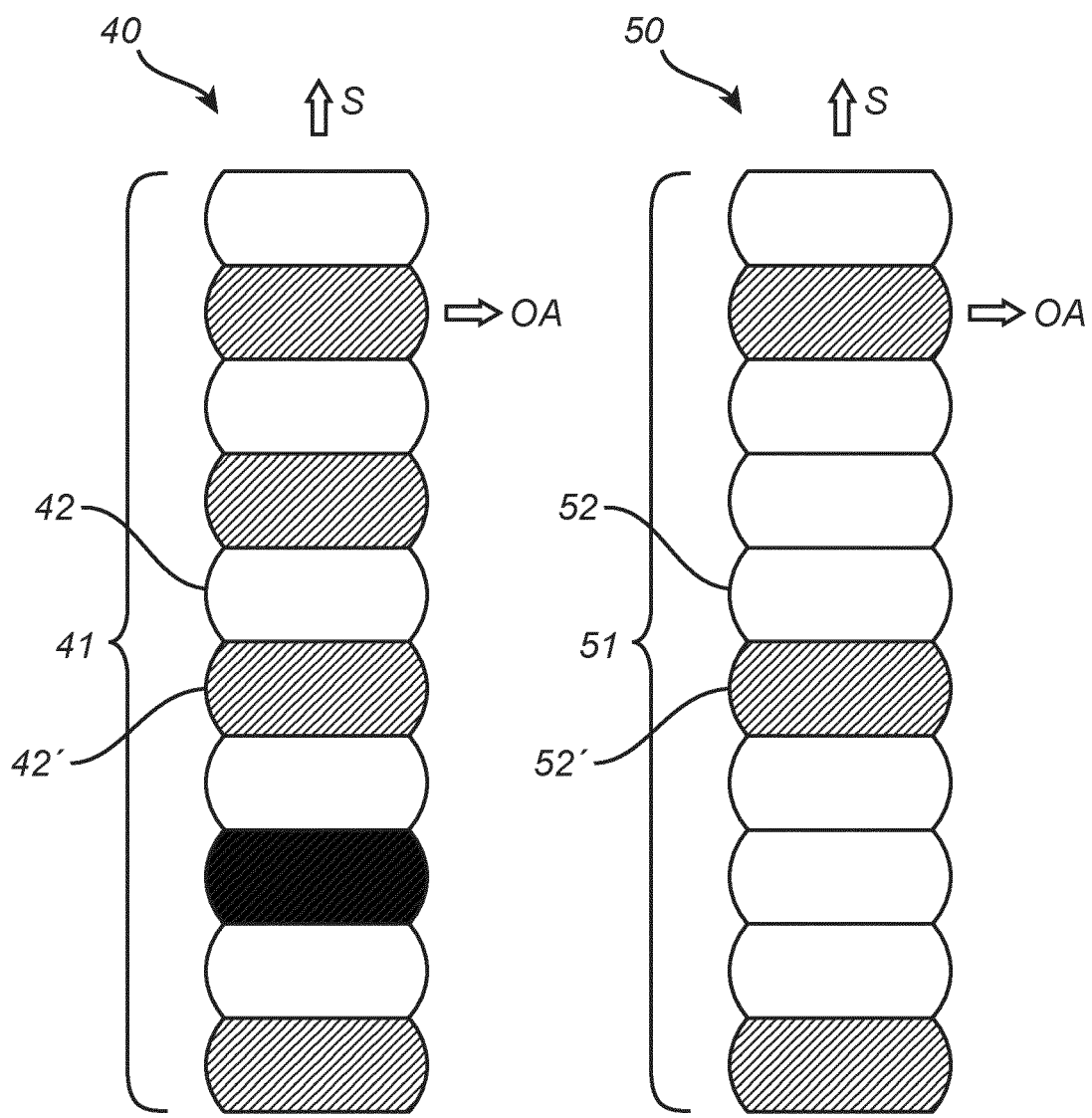

LIGHTING DEVICE HAVING A 3D PRINTED BICONVEX CYLINDRICAL LENS ARRAY

CROSS-REFERENCE TO PRIOR APPLICATIONS

This application is the U.S. National Phase application under 35 U.S.C. § 371 of International Application No. PCT/EP2016/075979, filed on Oct. 27, 2016, which claims the benefit of European Patent Application No. 15193626.7, filed on Nov. 9, 2015. These applications are hereby incorporated by reference herein.

TECHNICAL FIELD

The present invention relates to a method for producing an optical component for light manipulation by 3D printing. The present invention also relates to a 3D printed optical component and to a lighting device with a 3D printed optical component.

BACKGROUND

Beam shaping and color mixing optics for LED luminaires typically consist of extruded or injection molded components and microstructured films. An example of a film, namely a lenticular film, is disclosed in U.S. Pat. No. 8,705,175 B1. This lenticular film is formed by two films which have embossed lenticular patterns and which have been laminated together.

These optical components require a considerable investment in time and money (tooling costs in particular) to produce, and customization for better application performance is therefore rarely a feasible option. Conventional production technologies also have some limitations in their ability to produce certain types of complex optical components. For instance, integrating multiple materials into a single optical component is difficult using conventional production methods.

JP-A-2007008004 discloses a method for manufacturing an optical component. The method comprises the steps of selectively applying light to a photocurable resin liquid and forming a cured resin layer by repeating exposure while setting the projection area as a unit and laminating the cured resin layer successively to form a three-dimensional shape.

SUMMARY

In view of the foregoing, and according to a first aspect of the invention, there is provided a method for producing a light transmissive optical component that comprises 3D printing, using fused deposition modeling, a stack of at least two layers. Each layer is a biconvex cylinder lens having an optical axis perpendicular to a stacking direction of the stack.

The stack is 3D printed using fused deposition modeling. Fused deposition modeling, sometimes referred to as fused filament fabrication, is a 3d printing technique that is particularly suitable for producing optical components. By a "biconvex cylinder lens" is meant a lens which has two opposed convex faces. Both of the faces are sections of a cylinder.

Objects that are 3D printed using fused deposition modeling usually have a rippled surface, and this is often considered to be an unwanted artifact. The invention is based on the realization that these ripples can in fact be utilized for creating a certain type optical components for luminaires and other types of lighting devices because the ripples make it possible to in a very simple manner form layers of biconvex cylinder lenses that can be used for manipulating light in a great variety of ways, such as for mixing colors, diffusing light, focusing light and spreading out light. The use of 3D printing enables extensive customization of the optical components to meet application specific requirements without the need to invest in new equipment, something which is typically necessary when the components are microstructured films or when they are injection molded or extruded as in the prior art. Moreover, it is possible to produce optical components capable of manipulating light in ways that are difficult or even impossible to achieve with optical components produced using conventional technologies. For example, several materials having different optical properties may be integrated into the same optical component and different layers may be given different geometrical shapes.

By way of example, optical components having all kinds of combinations of portions that are anywhere from clear to strongly scattering can be produced by an appropriate choice of printing material. Further, by selecting the printing processing conditions (such as the printing speed and polymer flow) appropriately, the optical properties can be tuned for each layer individually or even within one single layer, for example by increasing or decreasing the flow rate while the printing speed is kept constant. In fact, in this way it is possible to produce optical components with optical properties that are fine tuned at every point on the optical component's light output surface. Such optical components may for example be adapted to shape light beams in a very precise way.

The use of 3D printing also makes it straightforward to produce optical components having a wide variety of different shapes, even free form shapes and closed shapes. So this technique allows for significant design flexibility, making it easier to provide optical components that fully meet application specific requirements.

In short, the method according to the first aspect of the invention combines versatility with cost effectiveness and opens up new possibilities for applications.

According to one embodiment of the first aspect of the invention, the stack is 3D printed such that the stack is curved in the stacking direction. This is desirable for some applications, and 3D printing makes it straightforward to produce such stacks.

According to one embodiment of the first aspect of the invention, the method comprises selecting printing processing conditions such that at least one layer has a desired aspect ratio, at least two layers have different aspect ratios, and/or at least one biconvex cylinder lens has a desired radius of curvature. In this way the beam shaping property of the optical component can be precisely adapted to the intended use. The optical component may for example be adapted to transmit light that is undistorted or has a large angular spread.

According to one embodiment of the first aspect of the invention, at least two layers are made of materials having different indices of refraction. Optical components with layers made of materials having different refractive indices are often suitable for decorative purposes because they can be made to exhibit a strong viewing angle dependence.

According to one embodiment of the first aspect of the invention, at least one layer comprises at least one of a light scattering material, a light absorbing material and a luminescent material. Optical components with clear layers and scattering, or diffuse, layers alternatingly arranged exhibit strong incident angle effects and may reduce glare in various lighting systems. Optical components with light absorbing materials may be used to design lighting devices having sharp cutoffs in their light intensity profile. Such lighting devices may exhibit almost no glare, something which makes them suitable as spots in museums, for instance. Luminescent materials may be used for wavelength converting light from monochrome light sources, such as blue light emitting diodes, so as to achieve light that appears white to the eye.

According to a second aspect of the invention, there is provided a light transmissive optical component that is 3D printed using fused deposition modeling. The optical component comprises a stack of two or more layers. Each layer is a biconvex cylinder lens having an optical axis perpendicular to a stacking direction of the stack. The effects and features of the second aspect of the invention are similar to those of the first aspect of the invention, and vice versa.

According to one embodiment of the second aspect of the invention, the stack is curved in the stacking direction.

According to one embodiment of the second aspect of the invention, at least two layers have different aspect ratios.

According to one embodiment of the second aspect of the invention, at least two layers have different refractive indices.

According to one embodiment of the second aspect of the invention, at least one layer comprises at least one of a light scattering material, a light absorbing material and a luminescent material.

The effects and features of the embodiments of the second aspect of the invention are similar to the effects and features of the embodiments of the first aspect of the invention, and vice versa.

According to a third aspect of the invention, there is provided a lighting device that comprises at least one optical component as described above and at least one light source. The at least one optical component is arranged to receive light emitted by the at least one light source. The effects and features of the third aspect of the invention are similar to those of the first and second aspects of the invention, and vice versa.

It is noted that the invention relates to all possible combinations of features recited in the claims.

BRIEF DESCRIPTION OF THE DRAWINGS

FIGS. 3 to 6 show schematic side views of additional examples of optical components.

DETAILED DESCRIPTION OF THE DRAWINGS

Figure 1:
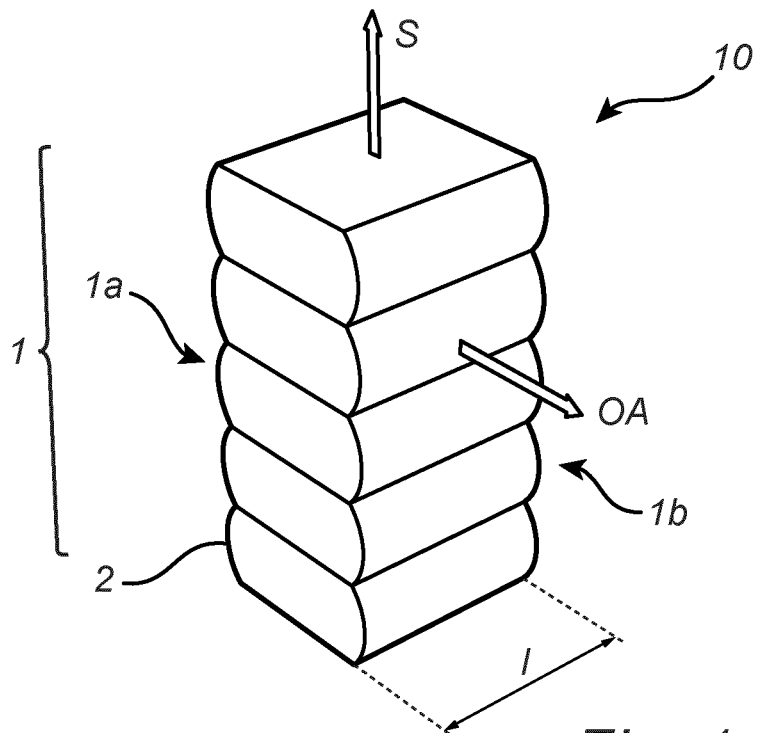
FIG. 1 shows a schematic perspective view of an example of an optical component.
Figure 2:
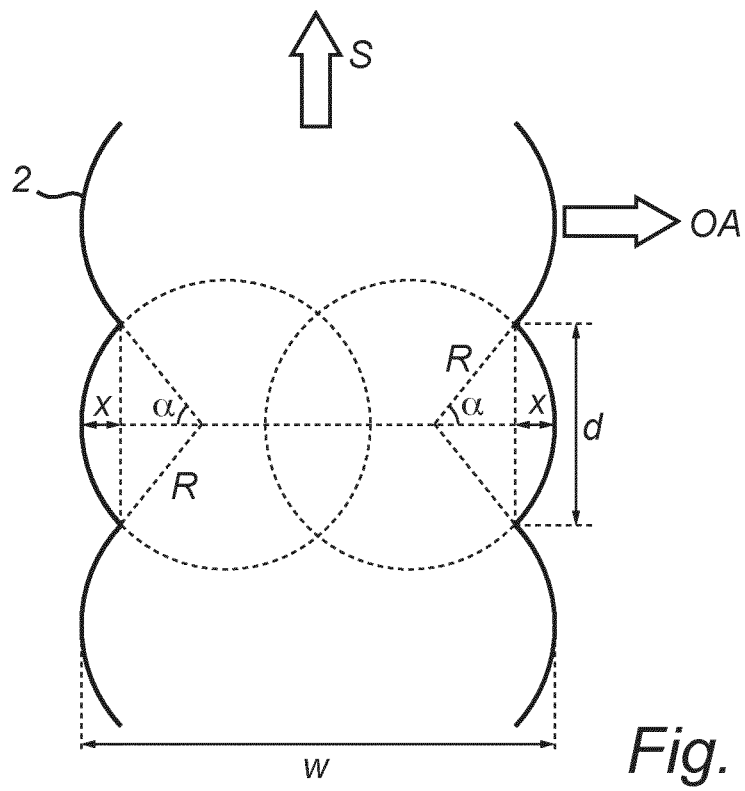
FIG. 2 shows a side view of a portion of the optical component in FIG. 1.

FIGS. 1 and 2 show a 3D printed optical component 10 comprising a stack 1 of layers 2. The stack 1 may alternatively be referred to as an array of layers or a sequence of layers. Five layers 2 are shown in FIG. 1, but in another example there may of course be a different number of layers 2. The layers 2 are formed by a light transmissive material, typically a polymer such as PMMA (poly(methyl methacrylate)), PC (polycarbonate) or PET (polyethylene terephtalate). The refractive index of the material is usually between 1 and 2, for example between 1.3 and 1.7 or between 1.5 and 1.6. All of the layers 2 are in this example formed by the same material, so all of the layers 2 have the same index of refraction. The layers 2 are arranged one on top of the other in a stacking direction S (the vertical direction in FIG. 1). The layers 2 are aligned so that the stack 2 is straight in the stacking direction S. Each layer 2 forms a biconvex cylinder lens the optical axis OA of which is perpendicular to the stacking direction S. The optical axis OA of a layer 2 is the axis along which light propagates through the layer 2, and the optical axes OA of the different layers 2 are parallel in this example. Light may enter the layers 2 through the stack's 1 light input surface 1a and may leave through the stack's light output surface 1b. The light input and light output surfaces 1a, 1b are rippled as a result of the 3D printing of the layers 2 which makes them bulge outwards. The stack 2 may be referred to as "double sided" in the sense that both the light input and light output surfaces 1a, 1b are rippled. The light input and light output surfaces 1a, 1b may also be referred to as lenticular surfaces.

All of the layers 2 have the same shape and size in this example. The length of the layers 2, as viewed in a direction perpendicular to the stacking direction S, is denoted by 1. The thickness d is parallel to the stacking direction S, and the width w is perpendicular to the stacking direction S and to the lengthwise direction. The width w is typically in the range from 0.05 mm to 2 mm. The thickness d is typically in the range from 0.05 mm to 2 mm. The length 1 may vary significantly between applications. For most applications, the length 1 is somewhere in the range from 1 mm to 2 m.

A useful design parameter is a layer's 2 aspect ratio which is defined as w/d, i.e. the width w divided by the thickness d. The aspect ratio may be between 1 and 5, for example between 1 and 4 or between 1 and 3. However, the aspect ratio may be greater than 5, for example greater than 10. Another useful design parameter is the radius of curvature R of a layer 2, i.e. the curvature at the interfaces between the layer 2 and the surrounding air. The radius of curvature R fulfills the relation $R=x/(1-\cos\alpha)$, where the distance x and the angle $\alpha$ are defined in FIG. 2. The distance x may for example be in the range from 0.05 mm to 2 mm. Typical values of the angle $\alpha$ lie in the range from 10 degrees to 90 degrees, for example between 30 degrees and 80 degrees or between 50 degrees and 70 degrees. The angle $\alpha$ may for example be about 60 degrees.

Figures 3, 4:
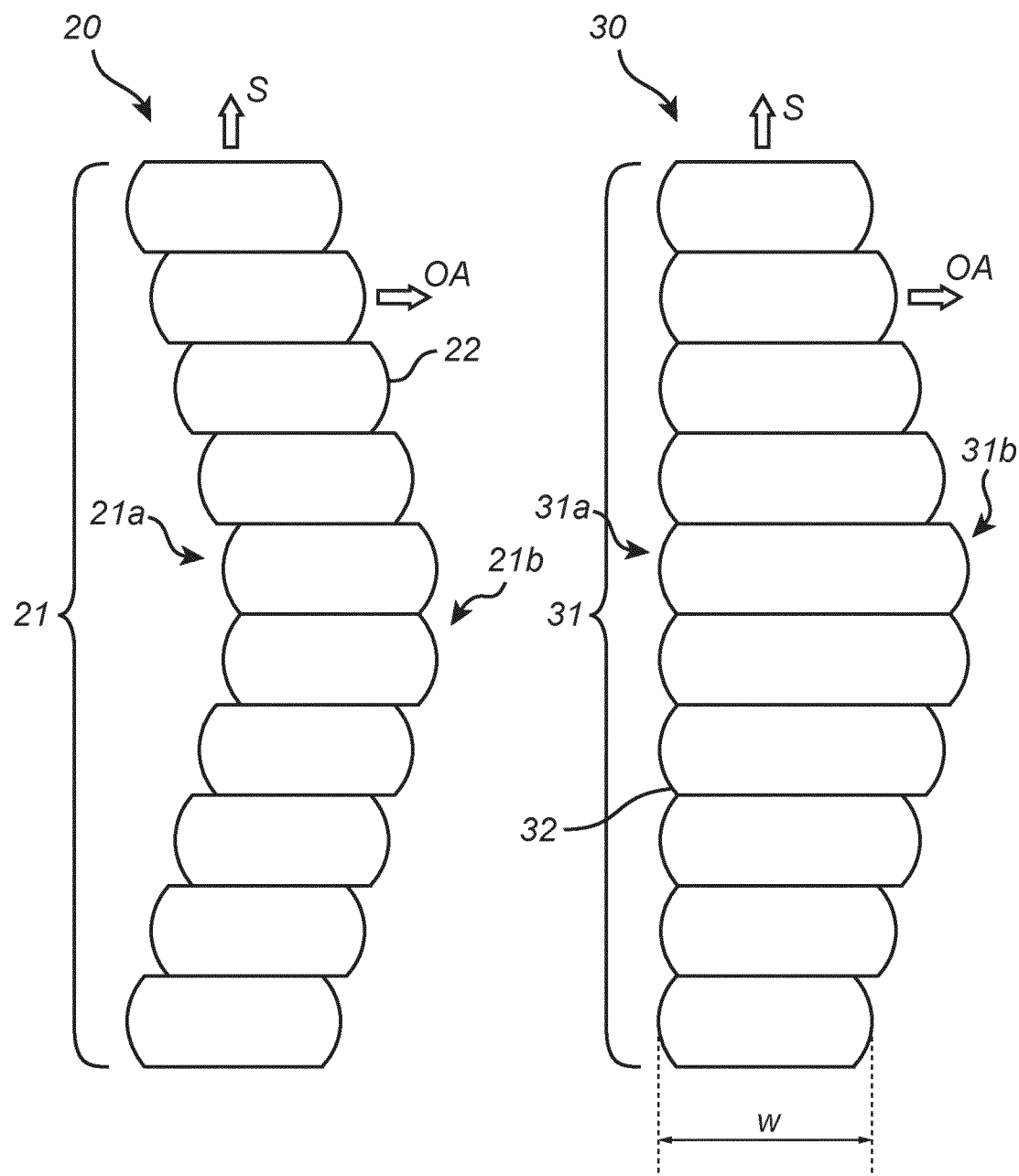

FIG. 3 shows an optical component 20 that is similar to the optical component 10 in FIGS. 1 and 2 except that the stack 21 is curved in the stacking direction S. This is a result of the layers 22 being displaced relative to each other along the optical axes OA. Hence, the light input surface 21a is generally concave, and the light output surface 21b is generally convex. It should be noted the optical component 20 can have many other types of free form shapes than the one illustrated in FIG. 3.

FIG. 4 shows an optical component 30 that is similar to the optical component in FIGS. 1 and 2 except that the layers 32 of the stack 31 have different widths w. As seen in the stacking direction S, the light input surface 31a is straight and the light output surface 31b is curved. The varying widths w result in the different layers 32 having different aspect ratios w/d. The layers 32 have the same thickness d in this example. Another way of varying the aspect ratio w/d between different layers 32 is by varying the thicknesses d while keeping the widths w constant or by varying both the widths w and the thicknesses d.

FIG. 5 shows an optical component 40 which is similar to the optical component 1 in FIGS. 1 and 2 except that the stack 41 of this optical component 40 has two types of layers 42, 42'. The two types of layers 42, 42' have the same shape and size but are made of different materials. The two materials have different indices of refraction. That is to say, one of the layers 42 has an index of refraction $n_1$ and the other layer 42' has an index of refraction $n_2$ which is different from $n_1$. The layers 42, 42' are alternating arranged in this example but may be arranged in some other way in another example. In other examples there may be three or more types of layers made of materials having different indices of refraction. Also, instead of being a straight stack with layers of equal widths, the stack 41 may of course be curved and/or have layers of different aspect ratios, similarly to the stacks 21, 31 in FIGS. 3 and 4 for instance.

FIG. 6 shows an optical component 50 which is similar to the optical component 10 in FIGS. 1 and 2. However, the optical component 50 in FIG. 6 has a stack 51 with two types of layers 52, 52', one layer 52 being a clear layer and the other layer 52' being a scattering layer. The scattering layer 52' may be a polymer layer that comprises light scattering particles, such as a PMMA layer with small $TiO_2$ particles. The layers 52, 52' are arranged so that there are three clear layers 52 between every scattering layer 52', but it is of course possible to arrange the layers 52, 52' differently. It should be noted that in another example the light scattering layer 52' may be replaced by some other type of layer, for example a layer containing a light converting dye, a light converting pigment, a photochromic pigment or a thermochromic pigment. Also, instead of being a straight stack with layers of equal widths, the stack 51 may of course be curved and/or have layers of different aspect ratios, similarly to the stacks 21, 31 in FIGS. 3 and 4 for instance.

Figure 7:
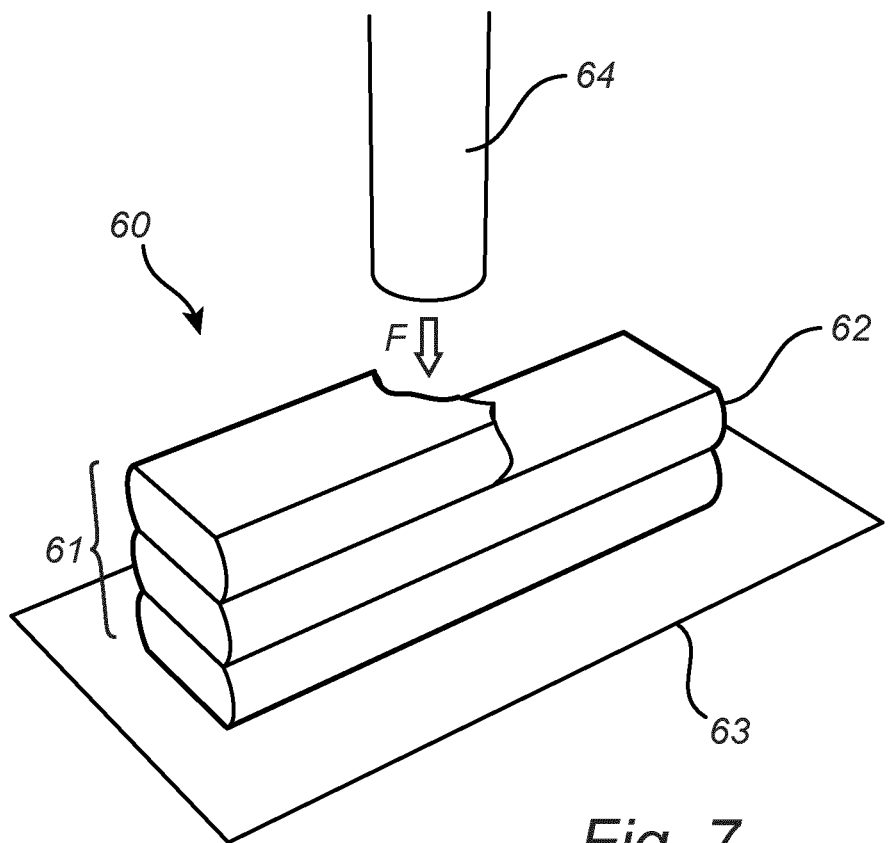
FIG. 7 illustrates schematically a method for producing an optical component.

FIG. 7 illustrates schematically a method for producing an optical component 60 such as those described above with reference to FIGS. 1 to 6. The method uses 3D printing to create a stack 61 of layers 62 on top of each other. Each layer 62 forms a biconvex cylinder lens. Initially, a first layer is printed on a substrate 63 by moving the printer nozzle 64 in a straight, or curved, path across the substrate 63. A second layer is then printed on top of the first layer, and additional layers may be printed by continuing to move the nozzle back and forth. This process continues until a desired number of layers 62 are obtained. The printing material(s) and/or the printing processing conditions, e.g. the speed of the nozzle and the speed of the flow F of printing material through the nozzle 64, determines the optical and geometrical properties of the layers 62.

Figure 8:
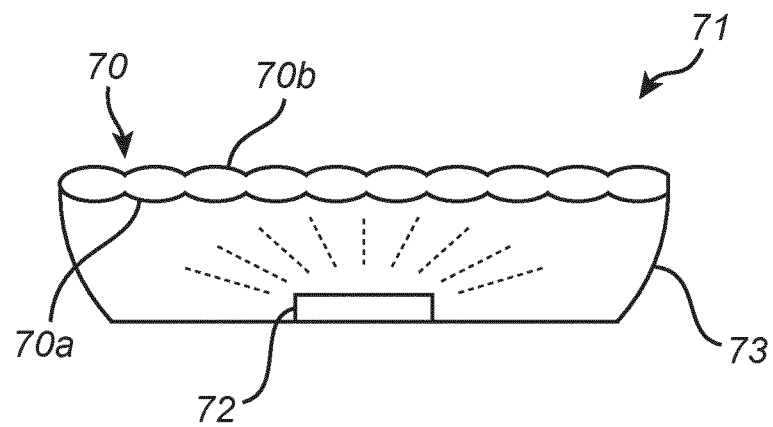
FIG. 8 shows a schematic side view of a lighting device.

FIG. 8 shows an optical component 70 integrated in a lighting device 71. The lighting device 71 also includes a light source 72 arranged to emit light to the optical component 70. The optical component 70 may be similar to any of the optical components described above with reference to FIGS. 1 to 7. The light source 72 and the optical component 70 are arranged in a housing 73. The light source 72 may be a solid state light source, for example a semiconductor light emitting diode, an organic light emitting diode, a polymer light emitting diode, or a laser diode. The illustrated lighting device 71 has only one light source 72, but there may of course be several light sources 72 in another example. The lighting device 71 can be intended for virtually any type of domestic or industrial use indoors or outdoors. Examples of possible applications include light bulbs and luminaires such as downlighters and spots. In use, the light source 72 emits light which enters the optical component 70 through the light input surface 70a and leaves the optical component through the light output surface 70b. The optical component 70 is adapted to affect the emitted light in some application specific way so that the light leaving the lighting device 71 suits the intended application.

It should be noted that in other examples of lighting devices the optical component 70 may be arranged with respect to the light source 72 in some other way than that illustrated in FIG. 8. For example, the stack of the optical component 70 may be curved so that the optical component 70 partly or completely encloses the light source 72.

The person skilled in the art realizes that the present invention by no means is limited to the examples described above. On the contrary, many modifications and variations are possible within the scope of the appended claims. For example, instead of being straight, the layers may have a curved, or generally free form, shape in their lengthwise direction. Also, the optical component may be used in applications without artificial light sources, for example luminescent solar concentrators and architectural applications such as daylight regulating windows.

Additionally, variations to the disclosed examples can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light transmissive optical component that is 3D printed using fused deposition modeling, the optical component comprising a stack of two or more layers, wherein the two or more layers are made of materials having different indices of refraction, and wherein each layer is a biconvex cylinder lens having an optical axis perpendicular to a stacking direction of the stack.

2. The optical component according to claim 1, wherein the stack is curved in the stacking direction.

3. The optical component according to claim 1, wherein a plurality of the at least two layers have different aspect ratios.

4. The optical component according to claim 1, wherein at least one layer of the at least two layers comprises at least one of a light scattering material, a light absorbing material and a luminescent material.

5. A lighting device comprising:
at least one light source; and
at least one optical component according to claim 1, wherein the at least one optical component is arranged to receive light emitted by the at least one light source.

6. A method for producing a light transmissive optical component, the method comprising:
3D printing a stack of at least two layers, wherein the at least two layers are made of materials having different indices of refraction, wherein each layer is a biconvex cylinder lens having an optical axis perpendicular to a stacking direction of the stack, and wherein the stack is 3D printed using fused deposition modeling.

7. The method according to claim 6, wherein the stack is 3D printed such that the stack is curved in the stacking direction.

8. The method according to claim 6 further comprising selecting printing processing conditions such that at least one layer of the at least two layers has a desired aspect ratio between 1 and 5.

9. The method according to claim 6 further comprising selecting printing processing conditions such that a plurality of the at least two layers have different aspect ratios.

10. The method according to claim 6 further comprising selecting printing processing conditions such that at least one biconvex cylinder lens has a desired radius of curvature between about 0.06 mm and 14.93 mm.

11. The method according to claim 6, wherein at least one layer of the least two layers comprises at least one of a light scattering material, a light absorbing material and a luminescent material.

* * * * *